(12) United States Patent
Ueda (10) Patent No.: US 10,727,104 B2
(45) Date of Patent: Jul. 28, 2020

(54) CONTROL APPARATUS

(71) Applicant: DAIHEN Corporation, Osaka-shi, Osaka (JP)

(72) Inventor: Kosuke Ueda, Osaka (JP)

(73) Assignee: DAIHEN Corporation, Osaka (JP)

( * ) Notice: Subject to any disclaimer, the term of this patent is extended or adjusted under 35 U.S.C. 154(b) by 215 days.

(21) Appl. No.: 15/933,600

(22) Filed: Mar. 23, 2018

(65) Prior Publication Data
US 2018/0286741 A1 Oct. 4, 2018

(30) Foreign Application Priority Data
Mar. 30, 2017 (JP) .................. 2017-068580

(51) Int. Cl.
*H01L 21/687* (2006.01)
*H01L 21/677* (2006.01)
(Continued)

(52) U.S. Cl.
CPC ...... *H01L 21/68707* (2013.01); *G05B 19/402* (2013.01); *G05B 19/4163* (2013.01); *H01L 21/67766* (2013.01)

(58) Field of Classification Search
CPC ........ H01L 21/68707; H01L 21/67766; G05B 19/402; G05B 19/4163
See application file for complete search history.

(56) References Cited

U.S. PATENT DOCUMENTS 5,415,057 A * 5/1995 Nihei .................. B25J 19/0012
16/400

6,684,128 B1 * 1/2004 Tounai ..................... B25J 9/102
318/568.14
(Continued)

FOREIGN PATENT DOCUMENTS

JP   A-2000-006064 A   1/2000
JP    S-1507859 A      9/2014

OTHER PUBLICATIONS https://studywolf.wordpress.com/2013/09/07/robot-control-3-accounting-for-mass-and-gravity/ (Year: 2013).*

*Primary Examiner* — Nicholas Kiswanto
(74) *Attorney, Agent, or Firm* — Troutman Sanders LLP (57) ABSTRACT

In order to solve a problem that a large load is applied to a particular shaft of a transfer robot in accordance with acceleration during transfer of a transfer target, a control apparatus for controlling a transfer robot having a hand portion and an arm portion includes: a calculating portion that calculates an inclination angle that is an angle of a leading shaft, which is a horizontal shaft on a leading end side of the arm portion, and a vertical velocity that is a velocity in an upper-lower direction of the hand portion such that, during movement of the transfer target, among moments that are applied to the leading shaft, a first moment according to force of inertia in association with the movement and a second moment according to the gravity weaken each other, and that a normal velocity component that is a velocity component of the hand portion in a normal direction of the transfer target is reduced; and a control portion that controls the arm portion according to a result of the calculation. Since control is performed such that the first and second moments are allowed to weaken each other, it is possible to reduce loads that are applied to the leading shaft during movement.

4 Claims, 10 Drawing Sheets

(51) Int. Cl.
*G05B 19/402* (2006.01)
*G05B 19/416* (2006.01)

(56) References Cited

U.S. PATENT DOCUMENTS

| | | | | |
|---|---|---|---|---|
| 8,134,324 B2 * | 3/2012 | Nishida | ............. | B25J 9/1623 |
| | | | | 318/567 |
| 8,613,474 B2 * | 12/2013 | Goodman | ......... | H01L 21/67092 |
| | | | | 294/189 |
| 9,117,856 B2 * | 8/2015 | Goodman | ......... | H01L 21/67092 |
| 9,221,172 B2 * | 12/2015 | Williamson | ......... | G05B 19/423 |

* cited by examiner

CONTROL APPARATUS

CROSS-REFERENCE TO RELATED APPLICATIONS

The present application claims priority from Japanese Patent Application No. 2017-068580 filed on Mar. 30, 2017, the entire contents of which are hereby incorporated by reference.

FIELD OF TECHNOLOGY

The present invention relates to a control apparatus for controlling a transfer robot for transferring a plate-like transfer target.

BACKGROUND

Conventionally, control of a transfer robot during transfer of a substrate has been performed such that, in order to prevent dislocation between the substrate and the hand due to high-velocity movement of the hand, the hand is inclined downward to the front in the traveling direction during acceleration, and is inclined downward to the rear in the traveling direction during deceleration (see JP 2000-006064A, for example).

Furthermore, as a transfer robot whose hand can be inclined, for example, there is a robot described in Japanese Design Registration No. 1507859.

SUMMARY

In a transfer robot, a load that is applied to each shaft during stoppage or operations varies depending on the posture of the robot. Accordingly, a large load may be applied to a particular shaft during acceleration, deceleration, or the like. Specifically, in the case where two horizontal arm portions are connected to a leading end of a vertical arm portion arranged on the base end side as in the transfer robot described in Document 2 above, a load is hardly applied to the shaft on the leading end side (the third shaft from the base end side) of the vertical arm portion during stoppage, but, when the transfer robot horizontally moves the shaft on the leading end side, a load is abruptly applied in response to the acceleration or deceleration. Furthermore, when the transfer robot is moving a transfer target, air resistance acts on the transfer target in association with the movement, as a result of which a load according to the air resistance is also applied to the shaft on the leading end side of the vertical arm portion. There is a demand to reduce such loads that are applied to a particular shaft in association with movement of a transfer target.

Generally speaking, there is a demand to reduce loads that are generated on a particular shaft of a transfer robot in association with movement of a transfer target.

The present invention was arrived at in view of these circumstances, and it is an object thereof to provide a transfer robot control apparatus capable of reducing loads that are generated on a particular shaft of a transfer robot in association with movement of a transfer target.

In order to achieve the above-described object, the present invention is directed to a control apparatus for controlling a transfer robot having a hand portion configured to hold a plate-like transfer target and an arm portion linked to the hand portion, including: a control portion that controls an inclination angle that is an angle of a leading shaft, which is a horizontal shaft on a leading end side of the arm portion, and a vertical velocity that is a velocity in an upper-lower direction of the hand portion such that, when the arm portion is moving the transfer target, among moments that are applied to the leading shaft, a first moment according to force of inertia in association with the movement and a second moment according to the gravity weaken each other, and that a normal velocity component that is a velocity component of the hand portion in a normal direction of the transfer target is reduced.

With this configuration, when the portion of the arm spanning from the leading shaft to the base end side is moving the hand portion, the first and second moments are allowed to weaken each other, and thus it is possible to reduce moments that are applied to the leading shaft. Furthermore, the normal velocity component of the hand portion is reduced, and thus air resistance that is applied in the normal direction of the transfer target during transfer can be reduced. As a result, for example, it is possible to reduce a moment that is applied to the leading shaft in accordance with the air resistance, and to prevent the transfer target from being detached.

Furthermore, the control apparatus according to the present invention may further include: a calculating portion that calculates the inclination angle and the vertical velocity such that, when the arm portion is moving the transfer target, the first moment and the second moment weaken each other, and that the normal velocity component is reduced, wherein, when the arm portion is moving the transfer target, the control portion controls the arm portion using the inclination angle and the vertical velocity calculated by the calculating portion.

With this configuration, it is possible to control the transfer robot, using a result calculated by the calculating portion. Thus, for example, it is possible to control the inclination angle and the vertical velocity in real-time according to the status of the transfer robot and the like.

Furthermore, the control apparatus according to the present invention may be such that, when the arm portion is moving the transfer target, the control portion controls the arm portion such that the first moment and the second moment are balanced with each other.

With this configuration, it is possible to substantially prevent a moment from being applied to the leading shaft even when the arm portion is moving the transfer target.

Furthermore, the control apparatus according to the present invention may be such that, when the arm portion is moving the transfer target, the control portion controls the arm portion such that a movement direction of the hand portion matches a surface direction of a surface of the transfer target.

With this configuration, it is possible to suppress, to the extent possible, air resistance that is received by the transfer target when the arm portion is moving the transfer target.

According to the control apparatus of the present invention, it is possible to reduce moments that are applied to a leading shaft when the arm portion is moving a transfer target.

DETAILED DESCRIPTION

Hereinafter, an embodiment of a control apparatus according to the present invention will be described. Note that constituent elements denoted by the same reference numerals are the same as or similar to each other in the following embodiment, and thus a description thereof may not be repeated. The control apparatus according to this embodiment causes a hand portion of a transfer robot to be inclined in a direction in which a moment resulting from force of inertia according to acceleration and a moment resulting from the gravity weaken each other, and controls a velocity of the hand portion in the upper-lower direction such that air pressure on a transfer target is reduced.

Figure 1:
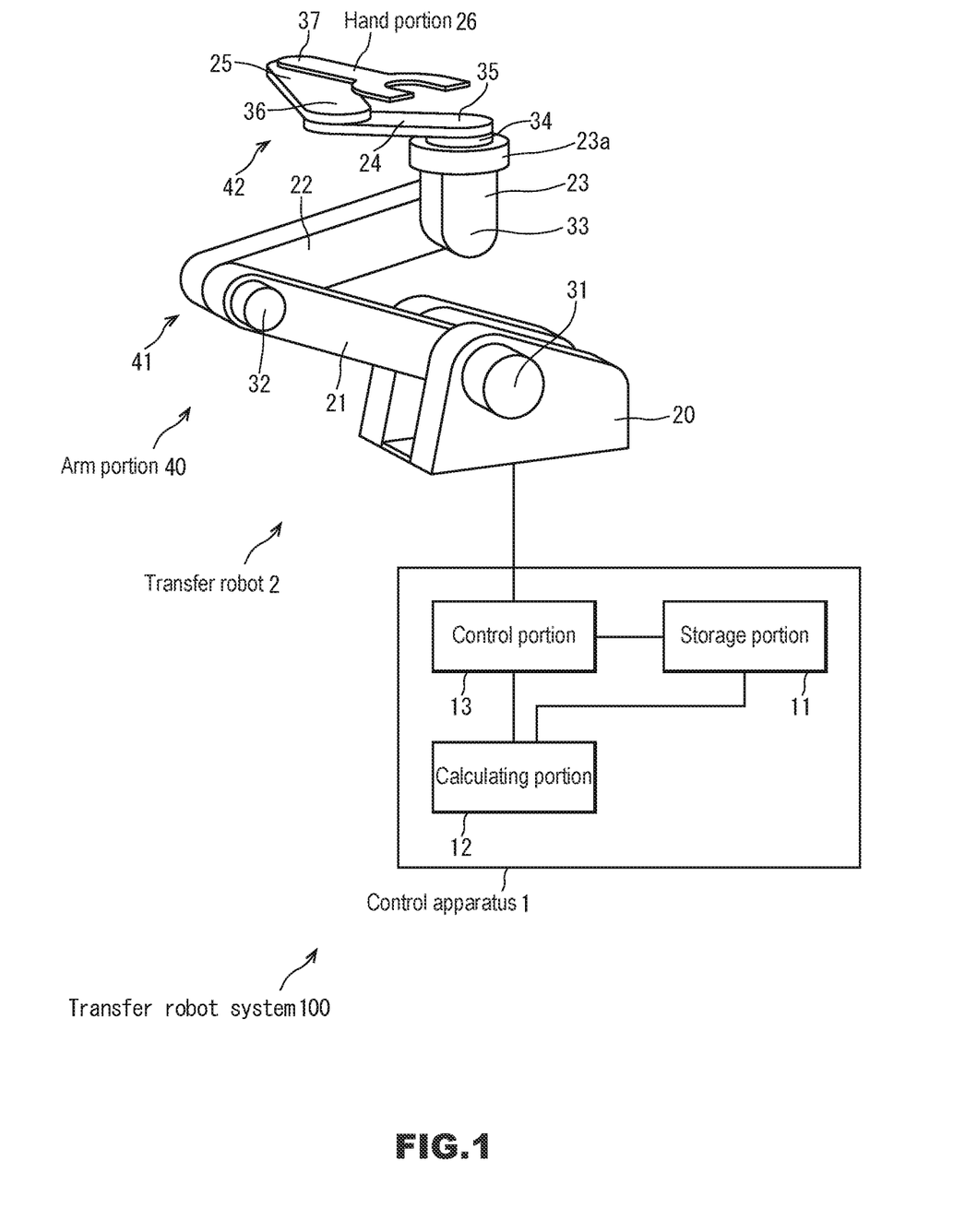
FIG. 1 is a diagram showing a transfer robot system according to an embodiment of the present invention.

FIG. 1 is a schematic diagram showing the configuration of a transfer robot system 100 according to this embodiment. The transfer robot system 100 according to this embodiment includes a control apparatus 1, and a transfer robot 2 for transferring a transfer target.

The transfer robot 2 includes a base portion 20, an arm portion 40 connected to the base portion 20 at its one end and having multiple arms linked to each other via joints that are driven by a motor, and a hand portion 26 linked to the leading end side of the arm portion 40. The arm portion 40 includes a vertical arm portion 41 having a first arm 21, a second arm 22, and a third arm 23, and a horizontal arm portion 42 having a fourth arm 24 and a fifth arm 25.

Figure 2:
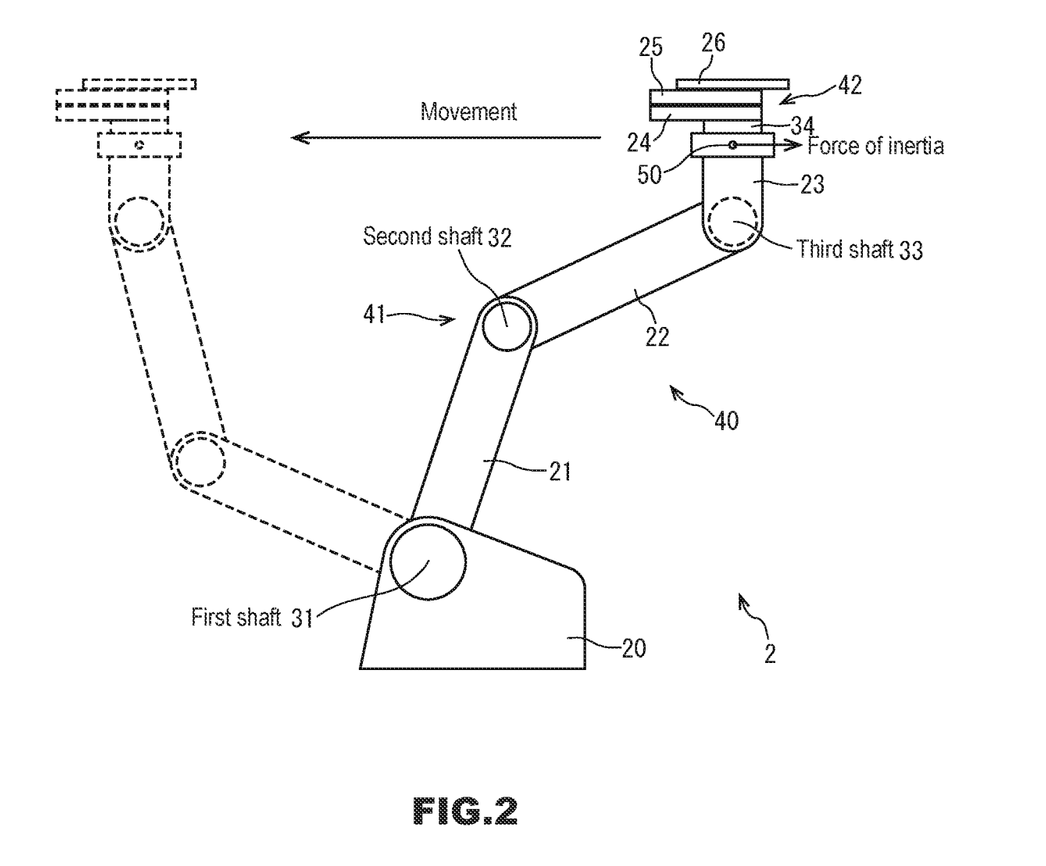
FIG. 2 is a diagram illustrating horizontal movement of a hand portion of a transfer robot.

The base end side of the first arm 21 included in the vertical arm portion 41 is supported by the base portion 20 via a first shaft 31 in a rotatable manner thereabout. The base portion 20 is preferably fixed to, for example, the floor or the like. The leading end side of the first arm 21 is linked to the base end side of the second arm 22 via a second shaft 32 in a rotatable manner thereabout. The leading end side of the second arm 22 is linked to the base end side of the third arm 23 via a third shaft 33 in a rotatable manner thereabout. The first to third arms 21 to 23 constitute the multi-joint vertical arm portion 41 in which the arms vertically operate. Each rotational shaft of the first shaft 31, the second shaft 32, and the third shaft 33 may be a horizontally extending rotational shaft. Furthermore, these rotational shafts may be parallel to each other. The rotational shafts are preferably driven by respective motors. As shown in FIG. 2, the vertical arm portion 41 can horizontally move the third shaft 33. The leading end side of the third arm 23 has a rotation base 23a to which the base end side of the horizontal arm portion 42 is linked in a rotatable manner. The third arm 23 is preferably controlled at the third shaft 33 such that the third arm vertically extends, that is, the upper face of the rotation base 23a is horizontally oriented, when the vertical arm portion 41 has stopped. The reason for this is to allow the horizontal arm portion 42 to operate as a horizontal multi-joint manipulator. When the position of the third arm 23 is being moved, that is, when the leading end side of the arm portion 40 is being moved by the vertical arm portion 41, the shafts in the portion spanning from the third shaft 33 to the leading end side are preferably not rotated.

The base end side of the fourth arm 24 included in the horizontal arm portion 42 is connected to the rotation base 23a via a fifth shaft 35 in a rotatable manner thereabout. In the strict sense, the base end side of the fourth arm 24 is connected to the rotation base 23a via a fourth shaft 34 that is coaxial with the fifth shaft 35. Accordingly, the base end side of the horizontal arm portion 42 is connected to the rotation base 23a in a swivelable manner in θ direction about the fourth shaft 34 that is a swivel shaft. The base end side of the fifth arm 25 is linked to the leading end side of the fourth arm 24 via a sixth shaft 36 in a rotatable manner thereabout. The base end side of the hand portion 26 is linked to the leading end side of the fifth arm 25 via a seventh shaft 37 in a rotatable manner thereabout. The fourth and fifth arms 24 and 25 constitute the multi-joint horizontal arm portion 42 in which the arms horizontally operate. Each rotational shaft of the fourth shaft 34, the fifth shaft 35, the sixth shaft 36, and the seventh shaft 37 may be a rotational shaft extending in a vertical direction (perpendicular direction) when the upper face of the rotation base 23a is horizontally oriented. Furthermore, these rotational shafts may be parallel to each other. The fourth shaft 34 that is a swivel shaft is preferably driven by a motor. The fifth shaft 35, the sixth shaft 36, and the seventh shaft 37 may be driven, for example, by one motor and transmission units that transmit a driving force of the motor, or by respective motors. The transmission units may be each configured, for example, by a belt and a pulley, or by multiple gears. With this configuration, for example, the hand portion 26 may also be linearly moved. That is to say, the fifth shaft 35, the sixth shaft 36, and the seventh shaft 37 may be driven, for example, such that the leading end side of the hand portion 26 is linearly moved. In that case, the linear direction is changed by the fourth shaft 34 that is a swivel shaft.

The hand portion 26 can hold a plate-like transfer target. The transfer target may be, for example, a substrate such as a semiconductor substrate or a glass substrate, or may be other thin plate-like objects. The hand portion 26 may have or may not have a chuck mechanism that can fix a transfer target such that the transfer target does not shift or drop during transfer. In the latter case, for example, a transfer target may be merely placed on the hand portion 26. The chuck mechanism included in the hand portion 26 may be, for example, a grasping mechanism, or may be a sucking mechanism. Note that the arm portion 40 may also have two or more horizontal arm portions. A multi-joint robot including the arm portion 40 having the vertical arm portion 41 on the base end side and the horizontal arm portion 42 on the leading end side and the hand portion 26 linked to the leading end of the arm portion 40 as in the transfer robot 2 according to this embodiment is described in Documents 1 and 2 above, for example, and is already known, and thus a detailed description thereof has been omitted.

Figure 3A:
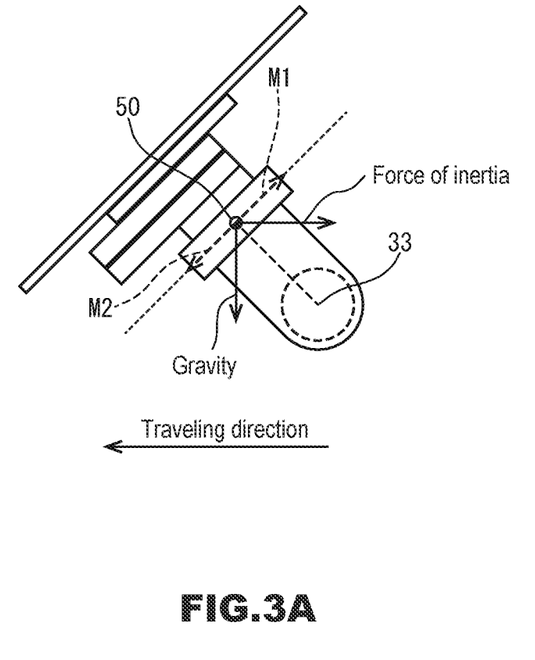
FIG. 3A is a diagram illustrating force of inertia and the like during movement of the hand portion.
Figure 3B:
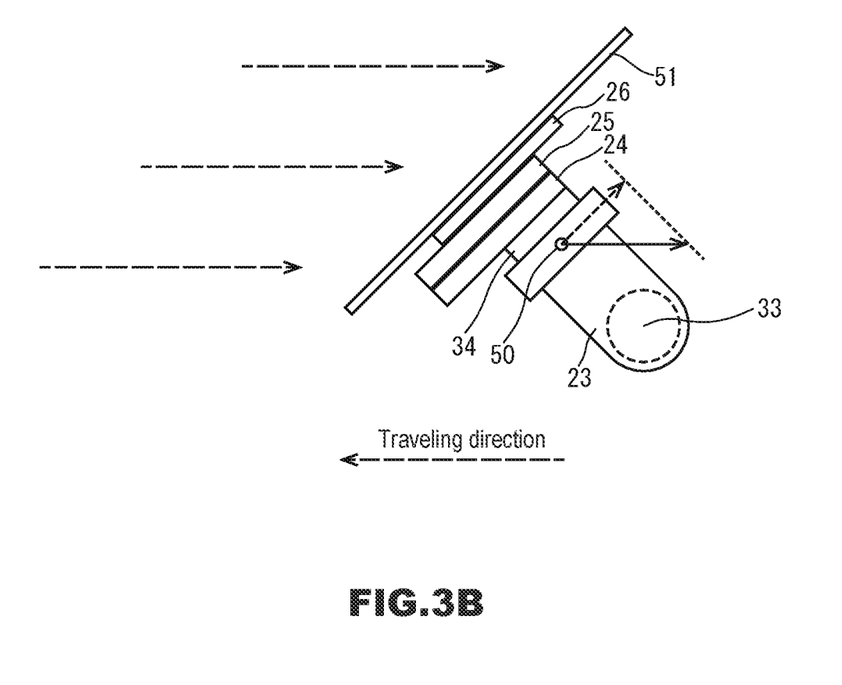
FIG. 3B is a diagram illustrating air resistance during movement of the hand portion.
Figure 3C:
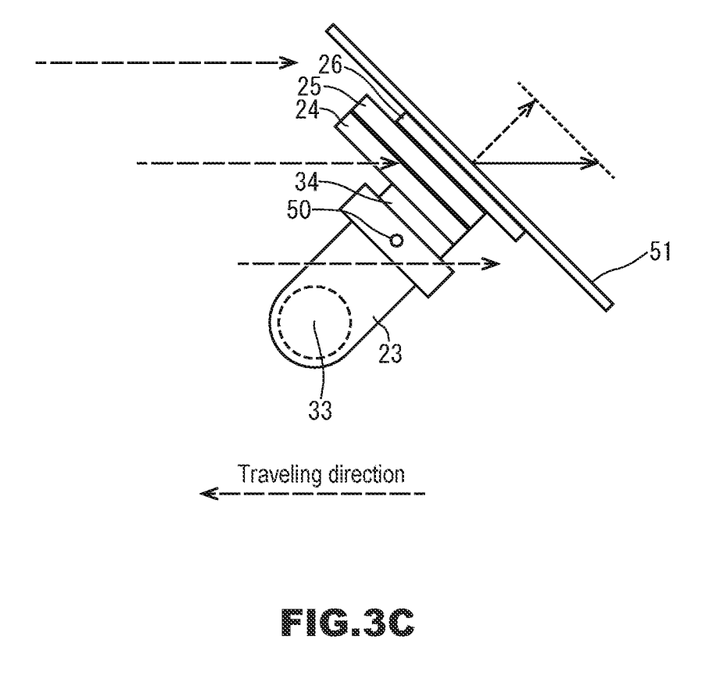
FIG. 3C is a diagram illustrating air resistance during movement of the hand portion.

When the transfer robot 2 has stopped and a center of gravity 50 of the portion spanning from the third arm 23 to the leading end side is located perpendicularly above the third shaft 33 as shown in FIG. 2, a moment (torque) is hardly applied to the third shaft 33. In this embodiment, the case in which the center of gravity 50 of the portion spanning from the third arm 23 to the leading end side is located perpendicularly above the third shaft 33 when the transfer robot 2 has stopped will be mainly described, and the other cases will be described later. On the other hand, when the hand portion 26 and the like horizontally move from the position indicated by the solid line to the position indicated by the broken line in FIG. 2, force of inertia according to acceleration of the movement is applied to the center of gravity 50, and a moment according to the force of inertia is applied to the third shaft 33. The load that is applied to the third shaft 33 increases in accordance with an increase in the absolute value of the acceleration of the movement. Recently, there is a demand to increase the transfer speed, and quick acceleration and quick deceleration are often performed. Thus, a load (torque) that is applied to each shaft tends to increase. In order to bear such a large load, it is necessary to use a high-power motor as a motor for driving the third shaft 33. Meanwhile, using such a high-power motor to drive the third shaft 33 that is a shaft on the leading end side of the vertical arm portion 41 is problematic in that a load on the first shaft 31 and the second shaft 32 increases. The reason for this is that a motor becomes heavier in accordance with an increase in its power. Accordingly, in order to use a high-power motor to drive the third shaft 33, it is also necessary to use high-power motors as motors for driving the first shaft 31 and the second shaft 32, which is problematic in that the size of the transfer robot 2 increases as a whole. Thus, it is necessary to suppress power of a motor for driving the third shaft 33 and, at the same time, to enable the shaft to bear a large acceleration load. In order to achieve such a configuration, for example, it is conceivable to cause the leading end side of the third shaft 33 to be inclined as shown in FIG. 3A such that a moment according to the force of inertia that is applied to the center of gravity 50 and a moment according to the gravity that is applied to the center of gravity 50 weaken each other. That is to say, in FIG. 3A, if a component M1, of the force of inertia, related to a moment that is applied to the third shaft 33 and a component M2, of the gravity, related to a moment that is applied to the third shaft 33 weaken each other, moments that are applied to the third shaft 33 can be reduced. Meanwhile, if the leading end side of the third shaft 33 is inclined as shown in FIG. 3B, air resistance is generated in a direction opposite to the traveling direction. Thus, a force indicated by the arrow in the solid line in FIG. 3B is newly added to the center of gravity 50 in accordance with the air resistance, and, of the force according to the air resistance, a component indicated by the arrow in the broken line acts as a moment on the third shaft 33. Furthermore, for example, if the traveling direction is opposite to that in FIG. 3B as shown in FIG. 3C, a force indicated by the arrow in the solid line in FIG. 3C is added to a transfer target 51. Thus, of the force according to the air resistance, a component indicated by the arrow in the broken line acts in a direction in which the transfer target 51 is moved away from the hand portion 26, and, when the component is large, the transfer target 51 may be possibly detached from the hand portion 26. Furthermore, even when the transfer target 51 is not detached, a moment according to the air resistance acts on the third shaft 33 as in the case of FIG. 3B. In order to reduce the moment that is applied to the third shaft 33 in accordance with the air resistance and to reduce the force in a direction in which the transfer target 51 is moved away from the hand portion 26, acting on the transfer target 51 in accordance with the air resistance, it is sufficient that the movement direction of the transfer target 51 matches the surface direction of the surface of the transfer target 51. This configuration can be achieved, for example, by adding the vertical direction (the Z direction movement) to the horizontal movement in FIGS. 3B and 3C. It is also conceivable that force of inertia vertically acts in accordance with the vertical movement. Accordingly, it is necessary that a first moment according to the force of inertia in association with the horizontal movement and the vertical movement is balanced with a second moment according to the gravity, and that the movement direction of the hand portion 26 matches the surface direction of the surface of the transfer target 51. A method for calculating an inclination angle of the third shaft 33 that realizes this configuration will be described with reference to FIG. 4.

Figure 4:
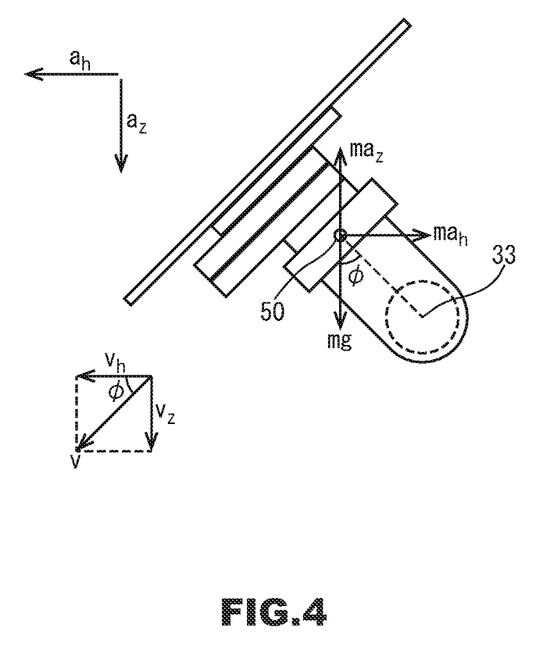
FIG. 4 is a diagram illustrating moments on a leading shaft in the embodiment.

FIG. 4 shows the case in which, when the third shaft 33 is horizontally moved in a predetermined velocity, a portion spanning from the third arm 23 to the leading end side is inclined such that the first and second moments are balanced with each other, and a velocity in the upper-lower direction is applied such that the movement direction matches the surface direction of the surface of the transfer target 51. Note that acceleration in the upper-lower direction is also generated in accordance with the velocity in the upper-lower direction. It is assumed that, in FIG. 4, the portion spanning from the third arm 23 to the leading end side is accelerated in a horizontal acceleration $a_h$ in which the left direction in the drawing is taken as positive, and is accelerated in a vertical acceleration $a_z$ in which the lower direction in the drawing is taken as positive. Thus, a horizontal force of inertia man in which the right direction in the drawing is taken as positive and a vertical force of inertia $ma_z$ in which the upper direction in the drawing is taken as positive are applied to the center of gravity 50. Note that m is a mass of the portion spanning from the third arm 23 to the leading end side. That is to say, the total mass from the third arm 23 to the hand portion 26 is "m". Furthermore, the inclination angle that is an angle of the third shaft 33 is taken as $\phi$. The inclination angle $\phi$ is an angle that is 0 when the flat plate-like transfer target 51 is horizontally oriented. In the case of the transfer robot 2 in which the center of gravity 50 of the portion spanning from the third arm 23 to the leading end side is located perpendicularly above the third shaft 33 during stoppage, the angle of a straight line connecting the third shaft 33 and the center of gravity 50 relative to the perpendicular direction also matches the inclination angle $\phi$. The inclination angle is an acute angle. Furthermore, it is assumed that, when inclined as in FIG. 3C, the inclination angle $\phi$ is negative. Furthermore, it is assumed that, in the portion spanning from the third arm 23 to the leading end side, a direction at a velocity v obtained by compositing a horizontal velocity $v_h$ in which the left direction in the drawing is taken as positive and a vertical velocity $v_z$ in which the lower direction in the drawing is taken as positive forms an angle $\phi$ relative to the horizontal velocity $v_h$ as shown in FIG. 4. The reason for this is that the hand portion 26 and the like have to be moved in the surface direction of the surface of the transfer target 51.

In FIG. 4, in order to allow the first moment according to the force of inertia and the second moment according to the gravity to be balanced with each other, the following equation has to be satisfied. In the equation, g is a constant of gravitation.

$$(mg - ma_z)\sin \phi = ma_h \cos \phi$$

This equation can be modified as follows.

$$\tan \phi = a_h/(g - a_z) \quad (1)$$

Furthermore, the following equation is obtained from a relationship between the horizontal velocity $v_h$, the vertical velocity $v_z$, and the inclination angle $\phi$.

$$\tan \phi = v_z/v_h \quad (2)$$

The following equation is obtained from Equations 1 and 2 above.

$$a_h/(g-a_z)=v_z/v_h \quad (3)$$

Furthermore, a relationship between the horizontal acceleration $a_h$ and the horizontal velocity $v_h$ and a relationship between the vertical acceleration $a_z$ and the vertical velocity $v_z$ are as in the following equations.

$$a_h=dv_h/dt \quad (4\text{-}1)$$

$$a_z=dv_z/dt \quad (4\text{-}2)$$

The following equation is obtained from Equations 3, 4-1, and 4-2 above.

$$v_h \times dv_h/dt = v_z(g-dv_z/dt) \quad (5)$$

Note that the left side of Equation 5 is typically known. The reason for this is that the hand portion 26 moves in a predetermined horizontal velocity. Thus, when the left side of Equation 5 is taken as α(t) and time t as a variable is indicated, the following differential equation is obtained.

$$dv_z(t)/dt = g - \alpha(t)/v_z(t) \quad (6)$$

When the differential equation shown in Equation 6 is solved through numerical analysis, $v_z(t)$ can be obtained. The initial value of $v_z(t)$ may be "0". Furthermore, the following equation is obtained from Equation 2.

$$\phi(t) = \tan^{-1}(v_z(t)/v_h(t)) \quad (7)$$

Thus, φ(t) can also be calculated by substituting the obtained $v_z(t)$ and the known $v_h(t)$ to Equation 7. Since the vertical velocity $v_z(t)$ and the inclination angle φ(t) of the third shaft 33 can be obtained in this manner, it is possible to allow the first and second moments in the third shaft 33 to be balanced with each other, and the hand portion 26 to move in the surface direction of the surface of the transfer target 51, by moving the third shaft 33 in the upper-lower direction in the vertical velocity $v_z(t)$ and rotating the third shaft 33 at the inclination angle φ(t), when moving the portion spanning from the third arm 23 to the leading end side, in a predetermined horizontal velocity $v_h$. It seems that, since the integration result of the vertical velocity $v_z$ from the start to the end of movement (i.e., distance of movement in the upper-lower direction using, as a reference, a position where the movement is started) is typically "0", the same result as that when movement is performed only in the predetermined horizontal velocity $v_h$ is obtained by performing movement in the predetermined horizontal velocity $v_h$ and the calculated vertical velocity $v_z$. Meanwhile, if the position in the upper-lower direction where the movement is ended in the case where the movement is performed in the calculated vertical velocity $v_z$ is different from that in the case where the movement is performed only in the predetermined horizontal velocity $v_h$, the position of the third shaft 33 may be moved in the upper-lower direction after the movement is ended, in order to correct the difference.

Figure 5:
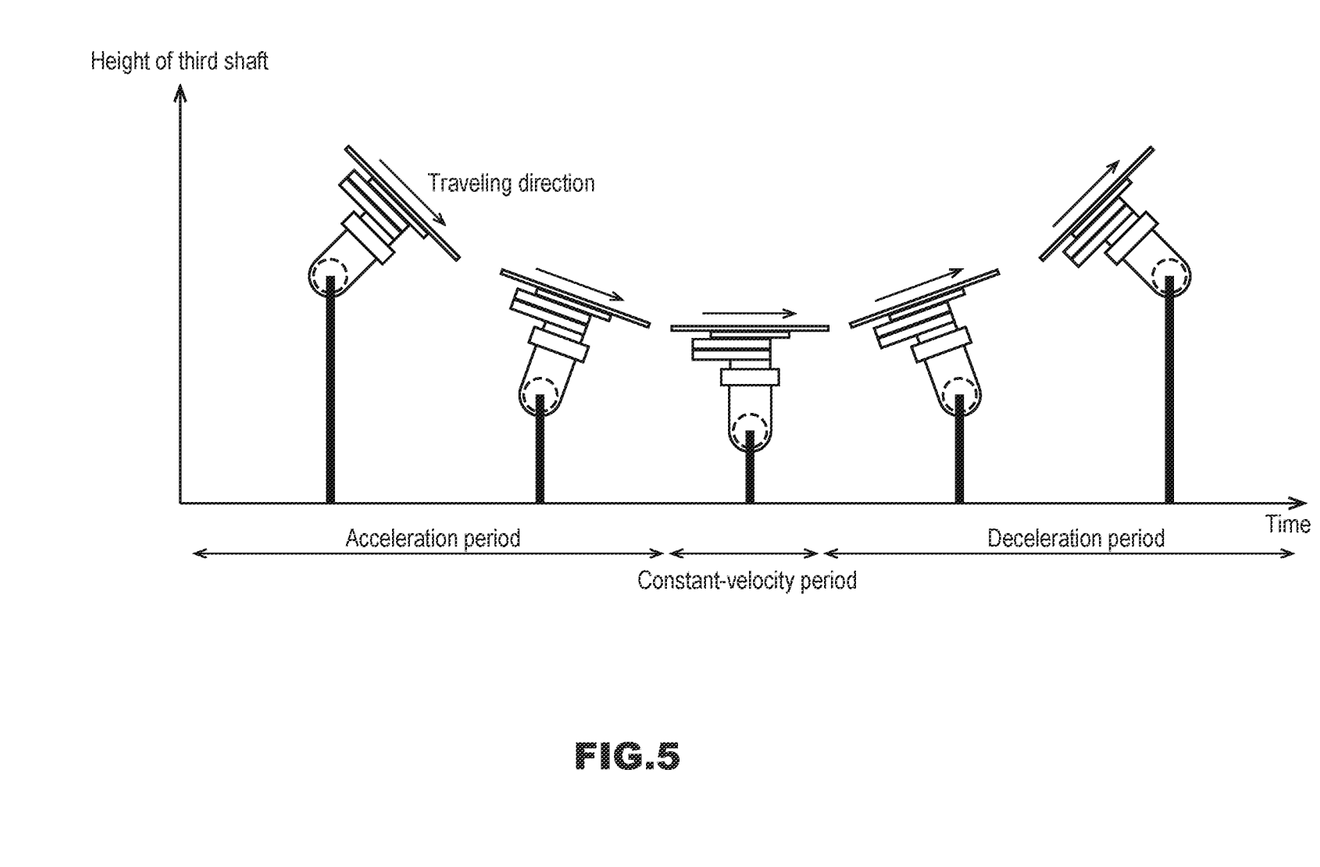
FIG. 5 is a diagram illustrating movement of the leading shaft in the upper-lower direction in the embodiment.

Hereinafter, a change in the height in the perpendicular direction of the third shaft 33 and a change in the inclination in accordance with horizontal movement of the leading end side of the arm portion 40 will be described with reference to FIG. 5. FIG. 5 is a diagram showing a time-series change in the height of the third shaft 33 and a time-series change in the inclination of the leading end side at the third shaft 33. During an acceleration period in which the hand portion 26 is accelerated in horizontal movement, the height of the third shaft 33 is gradually lowered in order to allow the traveling direction of the hand portion 26 to match the surface direction of the surface of the transfer target 51. Furthermore, during the acceleration, the leading end side of the arm portion 40 is inclined such that the front side (the right side in FIG. 5) of the horizontal component in the traveling direction is lower than the rear side (the left side in FIG. 5) of the horizontal component in the traveling direction, in order to allow the first moment according to the force of inertia in association with the acceleration (acting counterclockwise about the third shaft 33 of FIG. 5) and the second moment according to the gravity (acting clockwise about the third shaft 33 of FIG. 5) to be balanced with each other. That is to say, the hand portion 26 and the like are inclined downward to the front relative to the horizontal component in the traveling direction. On the other hand, during deceleration, the leading end side of the arm portion 40 is inclined such that the front side (the right side in FIG. 5) of the horizontal component in the traveling direction is higher than the rear side (the left side in FIG. 5) of the horizontal component in the traveling direction, in order to allow the first moment according to the force of inertia in association with the deceleration (acting clockwise about the third shaft 33 of FIG. 5) and the second moment according to the gravity (acting counterclockwise about the third shaft 33 of FIG. 5) to be balanced with each other. That is to say, the hand portion 26 and the like are inclined downward to the rear relative to the horizontal component in the traveling direction. Furthermore, during constant-velocity traveling or stoppage in which neither acceleration nor deceleration is performed, the leading end side of the arm portion 40 is such that the traveling direction and the surface direction of the surface of the transfer target 51 match the horizontal direction. Accordingly, during acceleration from a stoppage state to a constant-velocity movement state, the leading end side of the arm portion 40 is gradually changed from a horizontal orientation to a forward inclination orientation, after which the degree of the forward inclination is gradually lowered, and the leading end side returns to the horizontal orientation. During deceleration from a constant-velocity movement state to a stoppage state, the leading end side of the arm portion 40 is gradually changed from a horizontal orientation to a rearward inclination orientation, after which the degree of the rearward inclination is gradually lowered, and the leading end side returns to the horizontal orientation. The inclined or horizontal orientation and the like may also be considered as an inclined or horizontal orientation and the like of the surface direction of the surface of the transfer target 51 held by the hand portion 26. If no transfer target 51 is held by the hand portion 26, they may be considered as an inclined or horizontal orientation and the like of the surface direction of the surface of a transfer target 51 assuming that the transfer target 51 is held by the hand portion 26.

As shown in FIG. 1, the control apparatus 1 controls the transfer robot 2, and includes a storage portion 11, a calculating portion 12, and a control portion 13.

In the storage portion 11, for example, a taught path, a velocity during movement along the path, and the like may be stored. The path and the velocity may be, for example, a path and a velocity of any predetermined position of the hand portion 26. Specifically, the horizontal velocity $v_h(t)$ may be stored in advance in the storage portion 11. The horizontal velocity $v_h$ may be, for example, calculated using a taught path. Furthermore, in the storage portion 11, the vertical velocity $v_z(t)$, the inclination angle φ(t), and the like calculated by the calculating portion 12 may be stored, and other information may also be stored.

There is no limitation on the procedure in which information is stored in the storage portion 11. For example, information may be stored in the storage portion 11 via a storage medium, information transmitted via a communication line or the like may be stored in the storage portion 11, information input via an input device may be stored in the storage portion 11, or information calculated by the calculating portion 12 may be stored in the storage portion 11. In the storage portion 11, information may be temporarily stored in a RAM or the like, or may be stored for a long period of time. The storage portion 11 can be realized by any storage medium (e.g., a semiconductor memory, a magnetic disk, etc.).

The calculating portion 12 calculates the inclination angle of the leading shaft and the vertical velocity of the hand portion 26 such that, when the arm portion 40 is moving the transfer target 51, among moments that are applied to the leading shaft of the arm portion 40, a first moment according to the force of inertia in association with the movement and a second moment according to the gravity are balanced with each other, and that the movement direction of the hand portion 26 matches the surface direction of the surface of the transfer target 51. "When the arm portion 40 is moving the transfer target 51" refers to a period in which the vertical arm portion 41 of the arm portion 40 is moving the transfer target 51. Accordingly, typically, during the movement, the horizontal arm portion 42 does not operate. The leading shaft of the arm portion 40 is a shaft on the leading end side of the arm portion 40. The first and second moments that are applied to the leading shaft are balanced with each other during movement, and thus the leading shaft is typically a horizontal shaft, that is, a horizontally extending shaft. During stoppage, it is preferable that a load is not applied to the leading shaft. Note that the leading shaft does not have to be a shaft on the most leading end side of the arm portion 40. A shaft on the most leading end side among the shafts of the arm portion 40 satisfying the above-described conditions may be considered as the leading shaft. In the transfer robot 2 shown in FIG. 1, the third shaft 33 is the leading shaft. "The first and second moments are balanced with each other" refers to a state in which both moments have the same magnitude and are in opposite orientations, and thus they cancel each other. The balancing may be substantial balancing, and, for example, there may be a difference such as an error between the first and second moments. The inclination angle of the leading shaft is the angle at the leading shaft. The inclination angle is preferably the angle of the portion spanning from the leading shaft to the leading end side (e.g., the third arm 23, etc.) in the world coordinate system, such as $\phi$ described above. The inclination angle may also be, for example, an angle in which an angle during stoppage, that is, when a moment is not applied to the leading shaft is taken as a reference (e.g., 0 degrees). $\phi$ described above is this sort of angle. The vertical velocity of the hand portion 26 is the velocity of the hand portion 26 in the upper-lower direction. In the description above, $v_z(t)$ is the vertical velocity. The calculating portion 12 can acquire the vertical velocity $v_z(t)$ by solving the differential equation of Equation 6 above through numerical calculation using the horizontal velocity $v_h(t)$ stored in the storage portion 11 as described above. Furthermore, the inclination angle $\phi(t)$ can be calculated through Equation 7 above using the calculated vertical velocity $v_z(t)$ and the horizontal velocity $v_h(t)$ stored in the storage portion 11. The calculating portion 12 may also accumulate the acquired vertical velocity $v_z(t)$ and inclination angle $\phi(t)$ in the storage portion 11.

In this example, a case was described in which the inclination angle and the vertical velocity are calculated such that the first and second moments are balanced with each other and that the movement direction of the hand portion 26 matches the surface direction of the surface of the transfer target 51, but there is no limitation to this. The load that is applied to the leading shaft can be reduced even when the first and second moments are not completely balanced with each other, and the moment according to the air resistance and the force acting in the direction in which the transfer target 51 is detached can be reduced even when the movement direction of the hand portion 26 does not completely match the surface direction of the surface of the transfer target 51, as a result of which the effect of eliminating the necessity for a high-power motor for the leading shaft and the effect of preventing the transfer target 51 from being detached can be obtained. Accordingly, the calculating portion 12 may also calculate the inclination angle and the vertical velocity such that, for example, when the arm portion 40 is moving the transfer target 51, the first and second moments weaken each other and that the normal velocity component is reduced. "The first and second moments weaken each other" refers to a state in which, as a result, the first and second moments act in directions in which they reduce each other, and one of the moments does not have to be completely canceled by the other moment (i.e., the first and second moments do not have to be balanced with each other). However, it is preferable that the first and second moments weaken each other such that a load that is applied to the leading shaft is reduced if control according to the calculated inclination angle and vertical velocity is performed compared with the case where this control is not performed. The normal velocity component is a velocity component of the hand portion 26, and is a velocity component in the normal direction of the transfer target 51 that is held by the hand portion 26 (the transfer target 51 may or may not be actually held). "The normal velocity component is reduced" refers to a state in which the normal velocity component of the hand portion 26 is reduced if control according to the calculated inclination angle and vertical velocity is performed compared with the case where this control is not performed. Furthermore, if this control is performed, the angle (the smaller angle) between the movement direction of the hand portion 26 and the normal direction of the transfer target 51 becomes larger than that in the case where the control is not performed. As a result, the air resistance that is applied in the normal direction of the transfer target 51 in accordance with the movement of the hand portion 26 is reduced. In the case where the inclination angle and the vertical velocity are calculated such that, when the arm portion 40 is moving the transfer target 51, the first and second moments weaken each other and that the normal velocity component is reduced as described above, for example, the calculating portion 12 may select an inclination angle candidate and a vertical velocity candidate from among a predetermined group of discrete values, and, if a result obtained by compositing the first and second moments according to the selected inclination angle candidate and vertical velocity candidate is less than a predetermined threshold value, regard the selected inclination angle candidate and vertical velocity candidate as a final inclination angle and vertical velocity that are used in actual control. Furthermore, for example, the calculating portion 12 may calculate an inclination angle such that the first and second moments are balanced with each other assuming that there is no movement in the upper-lower direction when the arm portion 40 is moving the transfer target 51, and then determine a vertical velocity such that a result obtained by compositing the first and second moments does not exceed a predetermined threshold value without the above-described assumption. Accordingly, the result obtained by compositing the first and second moments does not at least exceed the threshold value, and the movement in the upper-lower direction is also performed, and thus at least the influence of the air resistance can be reduced.

The control portion 13 controls the arm portion 40, using the inclination angle and the vertical velocity calculated by the calculating portion 12, when the arm portion 40 is moving the transfer target 51. That is to say, the control portion 13 performs control such that the angle of the leading shaft matches the calculated inclination angle and that the velocity in the upper-lower direction of the leading shaft matches the calculated vertical velocity, when causing the vertical arm portion 41 to move the transfer target 51 held by the hand portion 26. The control is typically performed by controlling each shaft of the vertical arm portion 41. The control portion 13 controls the arm portion 40 to the calculated inclination angle and vertical velocity, thereby controlling the inclination angle of the leading shaft and the vertical velocity of the hand portion 26 such that the first and second moments weaken each other and that the normal velocity component of the hand portion 26 is reduced. Furthermore, in the case of controlling the arm portion 40 using the inclination angle and the vertical velocity calculated such that the first and second moments are balanced with each other, the control portion 13 performs control such that the first and second moments are balanced with each other. Furthermore, in the case of controlling the arm portion 40 using the inclination angle and the vertical velocity calculated such that the movement direction of the hand portion 26 matches the surface direction of the surface of the transfer target, the control portion 13 performs control such that the movement direction of the hand portion 26 matches the surface direction of the surface of the transfer target. It is assumed that the control portion 13 also performs control regarding the shafts of the arm portion 40 other than the leading shaft. For example, the control portion 13 may control each shaft of the horizontal arm portion 42 or the fourth shaft 34 that is a swivel shaft in order to move the transfer target 51 into or out of a slot or the like. Furthermore, when controlling the shafts of the arm portion 40, the control portion 13 may control them via a servo controller.

In this example, a case was described in which the calculating portion 12 calculates the vertical velocity $v_z(t)$ and the inclination angle $\phi(t)$ in advance before the transfer robot 2 operates, but there is no limitation to this. The calculating portion 12 may perform this calculation in real-time. In that case, the calculating portion 12 may use, for example, the latest horizontal velocity $v_h$, vertical velocity $v_z$, and the like when solving the differential equation of Equation 6. Furthermore, if the first and second moments do not have to be balanced with each other or if the movement direction of the hand portion 26 does not have to match the surface direction of the surface of the transfer target 51, the calculating portion 12 may calculate the inclination angle and the vertical velocity, for example, as follows. The calculating portion 12 may use an inclination angle $\phi$ calculated through Equation 7 above using an actual horizontal velocity $v_h$ and vertical velocity $v_z$ at a time $t_i$, as an inclination angle at a next time $t_{i+1}$. Furthermore, the calculating portion 12 may calculate a vertical acceleration $a_z$ through Equation 1 above using the calculated inclination angle $\phi$ and the actual horizontal acceleration an at a time $t_i$, and calculate a vertical velocity $v_z$ at a next time $t_{i+1}$ using the vertical acceleration $a_z$. The control portion 13 may control the arm portion 40 using the calculated inclination angle $\phi$ and vertical velocity $v_z$. Note that time $t_{i+1}=t_i+\Delta t$, where $\Delta t$ is preferably a value that is not large.

In this example, a case was described in which the control apparatus 1 has the calculating portion 12, and the arm portion 40 is controlled using the inclination angle and the vertical velocity calculated by the calculating portion 12, but there is no limitation to this. If the vertical velocity $v_z(t)$ and the inclination angle $\phi(t)$ are calculated in advance using the horizontal velocity $v_h(t)$ as described above, the control portion 13 may control the arm portion 40 by reading the vertical velocity $v_z(t)$ and the inclination angle $\phi(t)$ calculated in advance, from the storage portion 11. Accordingly, in that case, the control apparatus 1 does not have to include the calculating portion 12, and may also be an apparatus including the storage portion 11 in which the horizontal velocity $v_h(t)$, the vertical velocity $v_z(t)$, and the inclination angle $\phi(t)$ are stored, and the control portion 13 that controls the arm portion 40 using these pieces of information. Also in this case, the control portion 13 controls the inclination angle of the leading shaft and the vertical velocity of the hand portion 26 such that the first and second moments weaken each other and that the normal velocity component of the hand portion 26 is reduced, by controlling the arm portion 40 using the horizontal velocity $v_h(t)$, the vertical velocity $v_z(t)$, and the like stored in the storage portion 11. Even in the case where the control apparatus 1 does not include the calculating portion 12, the vertical velocity $v_z(t)$ and the inclination angle $\phi(t)$ stored in the storage portion 11 may be those obtained through calculation using a method similar to the calculation method by the calculating portion 12 as in the description above.

Next, an operation of the transfer robot system 100 will be described with reference to the flowchart in FIG. 6. In the description of the flowchart, it is assumed that the horizontal velocity $v_h$ is stored in advance in the storage portion 11.

(Step S101) The calculating portion 12 reads the horizontal velocity $v_h(t)$ stored in the storage portion 11.

(Step S102) The calculating portion 12 solves, for example, the differential equation of Equation 6 through numerical analysis using the read horizontal velocity $v_h(t)$, thereby calculating the vertical velocity $v_z(t)$. The calculated vertical velocity $v_z(t)$ may be accumulated in the storage portion 11.

(Step S103) The calculating portion 12 substitutes the read horizontal velocity $v_h$ and the calculated vertical velocity $v_z(t)$ for Equation 7, thereby calculating the inclination angle $\phi(t)$. The calculated inclination angle $\phi(t)$ may be accumulated in the storage portion 11.

(Step S104) The control portion 13 performs control such that the third shaft 33 that is the leading shaft of the arm portion 40 of the transfer robot 2 moves at the horizontal velocity $v_h(t)$ stored in the storage portion 11 and the vertical velocity $v_z(t)$ calculated by the calculating portion 12 and that the angle of the third shaft 33 matches the inclination angle $\phi(t)$, when the vertical arm portion 41 is moving the transfer target 51. Through this control, the hand portion 26 can be moved such that a moment according to the force of inertia that is applied to the leading shaft is reduced, and a velocity component in the normal direction of the transfer target 51 according to the movement is reduced.

Figure 6:
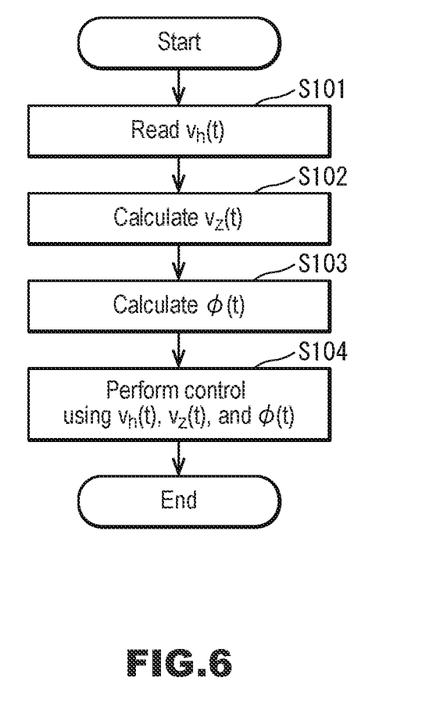
FIG. 6 is a flowchart showing an operation of a control apparatus in the embodiment.

Note that the processing in the flowchart in FIG. 6 is merely an example, and the transfer robot 2 may be controlled using other methods. For example, the calculating portion 12 may calculate the inclination angle $\phi(t)$ and then calculate the vertical velocity $v_z(t)$. Furthermore, the control portion 13 may also perform control regarding the horizontal arm portion 42.

As described above, according to the control apparatus 1 of this embodiment, it is possible to reduce loads that are generated on the leading shaft when the transfer robot 2 is transferring the transfer target 51. Thus, it is not necessary to use a high-power motor as a motor for driving the leading shaft, and thus the weight of the arm portion 40 can be reduced. As a result, it is not necessary to use high-power motors as motors for driving the shafts on the base end side of the arm portion 40 either, and thus the size of the arm portion 40 can be prevented from increasing as a whole. Furthermore, it is also possible to reduce the cost of the arm portion 40 in accordance with a decrease in the capacity of the motors for driving the shafts of the arm portion 40. Furthermore, since the motors can be low-power motors, it is also possible to use low-power drivers as drivers for operating the motors, and thus the size and the cost of the transfer robot system 100 can be reduced as a whole. As a result, the motor current during an operation of the transfer robot 2 can be reduced, and the consumption power can be also reduced. Furthermore, if control is performed such that the normal velocity component during movement of the hand portion 26 is reduced, moments that are generated on the leading shaft in accordance with the air resistance can be reduced, and the transfer target 51 can be prevented from being detached from the hand portion 26. Furthermore, if the calculating portion 12 is provided, for example, the inclination angle and the vertical velocity can also be calculated in real-time. Furthermore, if the inclination angle and the vertical velocity are calculated such that the first and second moments are balanced with each other, the effect of reducing a load on the leading shaft can be improved. Furthermore, if the inclination angle and the vertical velocity are calculated such that the movement direction of the hand portion 26 matches the surface direction of the surface of the transfer target 51, moments that are generated in accordance with the air resistance and a force acting in a direction in which the transfer target 51 is detached can be reduced to the extent possible. When the air resistance acting on the normal direction of the transfer target 51 is reduced to the extent possible, for example, it is also possible to prevent a transfer target 51 that is very thin from being broken during transfer.

Note that, when the hand portion 26 is not holding the transfer target 51, the influence of the moment according to the air resistance, described with reference to FIG. 3B, is not so large, and detachment of the transfer target 51 due to the air resistance, described with reference to FIG. 3C, does not occur. The reason for this is that the area of the hand portion 26 is typically smaller than that of the transfer target 51. Accordingly, control regarding the leading shaft may also be changed depending on whether or not the hand portion 26 is holding the transfer target 51. Specifically, when the hand portion 26 is holding the transfer target 51, control may be performed using the inclination angle and the vertical velocity calculated as described above, and, when the hand portion 26 is not holding the transfer target 51, control may be performed using an inclination angle calculated assuming that vertical velocity $v_z$=vertical acceleration $a_z$=0. In the latter case, the leading shaft is not moved in the upper-lower direction during movement of the hand portion 26. In the case where a taught path also contains movement in the upper-lower direction, even when the hand portion 26 is not holding the transfer target 51, the leading shaft is moved in the upper-lower direction as well. In that case, the inclination angle $\phi$ may be calculated by substituting the vertical acceleration $a_z$ and the vertical velocity $v_z$ calculated using Equations 4-1 and 4-2 for Equation 1 above.

Figure 7:
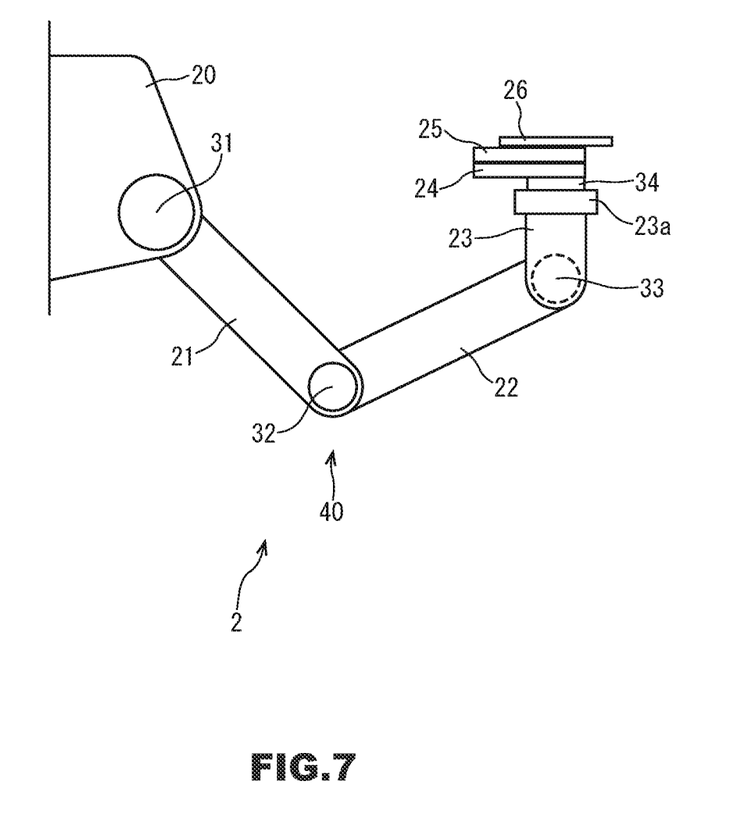
FIG. 7 is a diagram showing an example of the arrangement of the transfer robot in the embodiment.

Furthermore, in this embodiment, a case was described in which the base portion 20 of the transfer robot 2 is installed on a horizontal plane such as a floor face, but there is no limitation to this. As shown in FIG. 7, the base portion 20 of the transfer robot 2 may be installed on a wall face. In this manner, the transfer robot 2 that is to be controlled may also be of, for example, a wall-mounted type.

Figure 8:
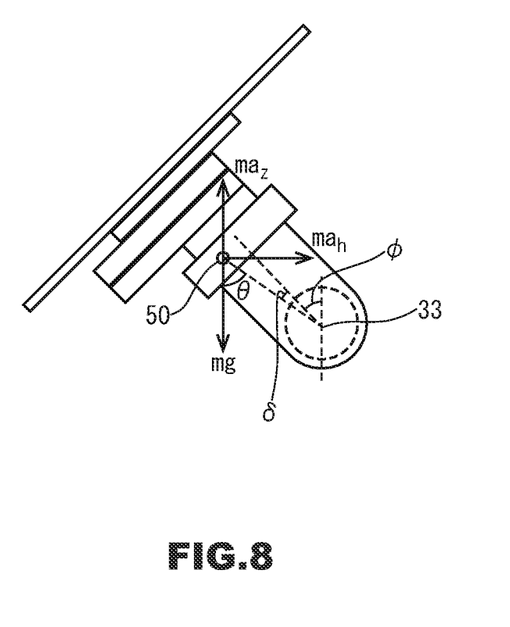
FIG. 8 is a diagram illustrating a center of gravity of the leading shaft and the like in the embodiment.

Furthermore, in this embodiment, a case was described in which the center of gravity 50 of the portion spanning from the third arm 23 to the leading end side is located perpendicularly above the third shaft 33 when the transfer robot 2 has stopped, but there is no limitation to this. In the case where the center of gravity 50 is not located perpendicularly above the third shaft 33 during stoppage, the arrangement during movement is, for example, as shown in FIG. 8. Note that the case where the center of gravity 50 is not located perpendicularly above the third shaft 33 during stoppage may be considered as a case in which the center of gravity 50 is not located on a straight line extending from the third shaft 33 in the normal direction of the transfer target 51 (i.e., the longitudinal direction of the third arm 23). FIG. 8 is a diagram corresponding to FIG. 4, and shows a case in which a portion spanning from the third arm 23 to the leading end side is inclined such that the first and second moments are balanced with each other, and a velocity in the upper-lower direction is applied such that the movement direction matches the surface direction of the surface of the transfer target 51, when the third shaft 33 is horizontally moved in a predetermined velocity. The inclination angle $\phi$ in FIG. 8 is the same as that in FIG. 4. In FIG. 8, when the angle of a straight line connecting the third shaft 33 and the center of gravity 50 relative to the perpendicular direction is taken as $\theta$, and the angle of a straight line connecting the third shaft 33 and the center of gravity 50 relative to a straight line extending from the third shaft 33 in the normal direction of the transfer target 51 is taken as $\delta$, $\theta=\phi+\delta$. In the equation, $\delta$ is a known value.

In the case of FIG. 8, Equations 1 and 2 above are as follows.

$$\tan\theta = a_h/(g-a_z) \tag{1'}$$

$$\tan\phi = \tan(\theta-\delta) = v_z/v_h \tag{2'}$$

Since $\tan(\theta-\delta)=(\tan\theta-\tan\delta)/(1+\tan\theta\tan\delta)$, Equation 3 above becomes as follows.

$$(a_h-(g-a_z)\tan\delta)/(g-a_z+a_h\tan\delta) = v_z/v_h \tag{3'}$$

Also in this case, the differential equation of $v_z(t)$ is obtained using Equation 3' and Equations 4-1 and 4-2 above based on that $v_h$ is known. Accordingly, $v_z(t)$ can be obtained by solving the differential equation through numerical analysis, and $\phi(t)$ can be obtained. In this manner, even in the case of a transfer robot 2 in which the center of gravity 50 of the portion spanning from the third arm 23 to the leading end side is not located perpendicularly above the third shaft 33 during stoppage, the vertical velocity $v_z(t)$ and the inclination angle $\phi(t)$ of the third shaft 33 can be obtained, and thus it is possible to allow the first and second moments in the third shaft 33 to be balanced with each other, and the hand portion 26 to move in the surface direction of the surface of the transfer target 51, by moving the third shaft 33 in the upper-lower direction in the horizontal velocity $v_h(t)$ and rotating the third shaft 33 at the inclination angle $\phi(t)$, when moving the portion spanning from the third arm 23 to the leading end side, in a predetermined horizontal velocity $v_h$.

Furthermore, the configuration of the transfer robot 2 described in this embodiment is merely an example, and the control apparatus 1 may also control a transfer robot having other configurations. For example, there is no limitation on the number of links and the number of shafts of the vertical arm portion 41 and the horizontal arm portion 42 included in the transfer robot 2. Furthermore, the transfer robot that is to be controlled may or may not have a vertical arm portion on the base end side, and a horizontal arm portion linked to a leading end side of the vertical arm portion. In the latter case, the transfer robot may also be, for example, a robot in which a hand portion is linked to the leading end of a vertical arm portion.

Furthermore, in the foregoing embodiment, each process or each function may be realized by centralized processing using a single apparatus or a single system, or may be realized by distributed processing using multiple apparatuses or multiple systems.

Furthermore, in the foregoing embodiment, information transmission performed between constituent elements may be such that, for example, if two constituent elements for transmitting information are physically different from each other, the transmission is performed by one of the constituent elements outputting the information and the other constituent element accepting the information, or alternatively, if two constituent elements for transmitting information are physically the same, the transmission is performed by shifting from a processing phase corresponding to one of the constituent elements to a processing phase corresponding to the other constituent element.

Furthermore, in the foregoing embodiment, information relating to the processing performed by each constituent element, for example, information that is to be accepted, acquired, selected, generated, transmitted, or received by each constituent element, information such as a threshold value, a numerical expression, or an address used by each constituent element in the processing and the like may be retained in an unshown storage medium temporarily or for a long period of time even if not specified in the description above. Furthermore, information may be accumulated in the unshown storage medium by each constituent element or by an unshown accumulating portion. Furthermore, information may be read from the unshown storage medium by each constituent element or by an unshown reading portion.

Furthermore, in the foregoing embodiment, if information used in each constituent element or the like, for example, information such as a threshold value, an address, or various setting values used in each constituent element in the processing may be changed by a user, the user may be or may not be allowed to change such information as appropriate even if not specified in the description above. If the user is allowed to change such information, the change may be realized by, for example, an unshown accepting portion that accepts a change instruction from the user and an unshown changing portion that changes information according to the change instruction. The change instruction may be accepted by the unshown accepting portion, for example, by accepting information from an input device, by receiving information transmitted via a communication line, or by accepting information read from a predetermined storage medium.

Furthermore, in the foregoing embodiment, each constituent element may be configured by dedicated hardware, or alternatively, constituent elements that can be realized by software may be realized by executing a program. For example, each constituent element may be realized by a program execution unit such as a CPU reading and executing a software program stored in a storage medium such as a hard disk or a semiconductor memory. At the time of executing the program, the program execution unit may execute the program while accessing the storage unit or the storage medium. Furthermore, this program may be executed by downloading from a server or the like, or may be executed by reading a program stored in a predetermined storage medium (e.g., an optical disk, a magnetic disk, a semiconductor memory, etc.). Furthermore, the program may be used as a program forming a program product. Furthermore, a computer that executes the program may be a single computer or may be multiple computers. That is to say, centralized processing may be performed, or distributed processing may be performed.

The present invention is not limited to the embodiment set forth herein. Various modifications are possible within the scope of the invention.

As described above, the control apparatus according to the present invention is effective in that, when a transfer robot is transferring a transfer target, a load that is generated on its leading shaft can be reduced, and thus it is useful as a control apparatus for controlling a transfer robot.

What is claimed is:

1. A control apparatus for controlling a transfer robot having a hand configured to hold a plate-like transfer target and an arm portion linked to the hand, comprising:
   a processor configured to control an inclination angle that is an angle of a leading shaft, which is a horizontal shaft on a leading end side of the arm portion, and a vertical velocity that is a velocity in an upper-lower direction of the hand such that, when the arm portion is moving the transfer target, among moments that are applied to the leading shaft, a first moment according to force of inertia in association with the movement and a second moment according to the gravity weaken each other, and that a normal velocity component that is a velocity component of the hand portion in a normal direction of the transfer target is reduced.

2. The control apparatus according to claim 1,
   wherein the processor is configured to calculate the inclination angle and the vertical velocity such that, when the arm portion is moving the transfer target, the first moment and the second moment weaken each other, and that the normal velocity component is reduced,
   wherein, when the arm portion is moving the transfer target, the processor is configured to control the arm portion using the inclination angle and the vertical velocity calculated by the processor.

3. The control apparatus according to claim 1, wherein, when the arm portion is moving the transfer target, the processor is configured to control the arm portion such that the first moment and the second moment are balanced with each other.

4. The control apparatus according to claim 1, wherein, when the arm portion is moving the transfer target, the processor is configured to control the arm portion such that a movement direction of the hand matches a surface direction of a surface of the transfer target.

* * * * *